(12) United States Patent
Amano (10) Patent No.: US 6,767,429 B2
(45) Date of Patent: Jul. 27, 2004

(54) VACUUM PROCESSING APPARATUS (75) Inventor: Hideaki Amano, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 274 days.

(21) Appl. No.: 09/890,833

(22) PCT Filed: Jan. 11, 2001

(86) PCT No.: PCT/JP01/00081
§ 371 (c)(1),
(2), (4) Date: Nov. 9, 2001

(87) PCT Pub. No.: WO01/51680
PCT Pub. Date: Jul. 19, 2001

(65) Prior Publication Data
US 2002/0134308 A1 Sep. 26, 2002

(30) Foreign Application Priority Data
Jan. 12, 2000 (JP) ........................................ 2000-003337

(51) Int. Cl.$^7$ .......................... C23F 1/00; H01L 21/306; H01L 21/3065; C23C 16/00
(52) U.S. Cl. ............................ 156/345.29; 156/345.33; 156/345.34; 156/345.43; 156/345.44; 156/345.47; 156/345.51; 156/345.52; 156/345.53; 156/345.54; 118/715; 118/723 E; 118/728; 118/729
(58) Field of Search ........................ 156/345.33, 345.34, 156/345.43, 345.44, 345.47, 345.51, 345.52, 345.53, 345.54, 345.29; 118/715, 723 E, 728, 729; 427/248.1, 569

(56) References Cited

U.S. PATENT DOCUMENTS

| | | | |
|---|---|---|---|
| 4,842,683 A | * | 6/1989 | Cheng et al. .......... 156/345.37 |
| 4,985,281 A | * | 1/1991 | Ahlgren ....................... 117/102 |
| 5,021,114 A | * | 6/1991 | Saito et al. ............ 156/345.42 |
| 5,552,017 A | | 9/1996 | Jang et al. |
| 5,685,912 A | * | 11/1997 | Nishizaka .................... 118/719 |
| 6,083,344 A | * | 7/2000 | Hanawa et al. ........ 156/345.28 |
| 6,251,188 B1 | * | 6/2001 | Hashimoto et al. ......... 118/715 |
| 6,273,023 B1 | * | 8/2001 | Tsuchihashi et al. ..... 118/723 E |
| 6,287,635 B1 | * | 9/2001 | Cook et al. ............ 427/255.18 |
| 6,589,023 B2 | * | 7/2003 | Royce et al. ............... 417/251 |
| 6,701,066 B2 | * | 3/2004 | Sandhu ....................... 392/386 |
| 2001/0047849 A1 | * | 12/2001 | Jiwari et al. ................ 156/345 |
| 2002/0134308 A1 | * | 9/2002 | Amano ....................... 118/715 |
| 2002/0148565 A1 | * | 10/2002 | Schneider et al. ..... 156/345.51 |

FOREIGN PATENT DOCUMENTS

| | | |
|---|---|---|
| EP | 819 780 | 1/1998 |
| JP | 60-227414 | * 11/1985 |
| JP | 11-243079 | 9/1999 |

* cited by examiner

Primary Examiner—Jeffrie R. Lund
(74) Attorney, Agent, or Firm—Pillsbury Winthrop LLP (57) ABSTRACT In a plasma CVD apparatus for applying a film deposition process to a semiconductor wafer (W), a wafer placement stage (3) is provided at a center of a vacuum chamber (2). The placement stage (3) is mounted to a side wall (63) via a support part (6). An exhaust port (9) having a diameter equal to or smaller than a diameter of the placement stage (3) is provided under the placement stage (3). A center axis (C1) of the exhaust port (9) is displaced from a center axis of the placement stage (3) in a direction opposite to an extending direction of the support part (6), thereby achieving an efficient exhaust.

13 Claims, 6 Drawing Sheets

VACUUM PROCESSING APPARATUS

This application is the National Phase of International Application PCT/JP01/00081 filed Jan. 11, 2001 which designated the U.S. and that International Application was not published under PCT Article 21(2) in English.

TECHNICAL FIELD

The present invention relates to vacuum processing apparatuses and, more particularly, to a vacuum processing apparatus, which applies a film deposition process or the like to an object to be processed such as a semiconductor wafer under a vacuum.

BACKGROUND ART

There are plasma CVD (chemical vapor deposition) apparatuses for processing a semiconductor wafer (hereinafter referred to as "wafer"). Conventionally, a parallel plate type CVD apparatus is known as such kind of apparatus. In the parallel plate type CVD apparatus, a wafer placement stage constituting a lower electrode is positioned in the center of a vacuum chamber, and a gas supply part constituting an upper electrode is provided so as to face the placement stage. Plasma is generated by applying a voltage between the upper electrode and the lower electrode and the generated plasma is irradiated to the wafer so as to form a predetermined thin film on the wafer. The in-surface uniformity of the thin film formed on the wafer is greatly affected by an isotropy of the exhaust from the vacuum chamber. Accordingly, the exhaust port is provided directly under the placement stage so as to achieve the isotropy of the exhaust.

On the other hand, there is a technical demand for the plasma CVD apparatus to improve a gap fill characteristic. In order to improve the gap fill characteristic, a large flow and high-vacuum process is needed, which cannot be achieved by a conventional apparatus. The reason for this is explained with reference to FIG. 1.

Figure 1:
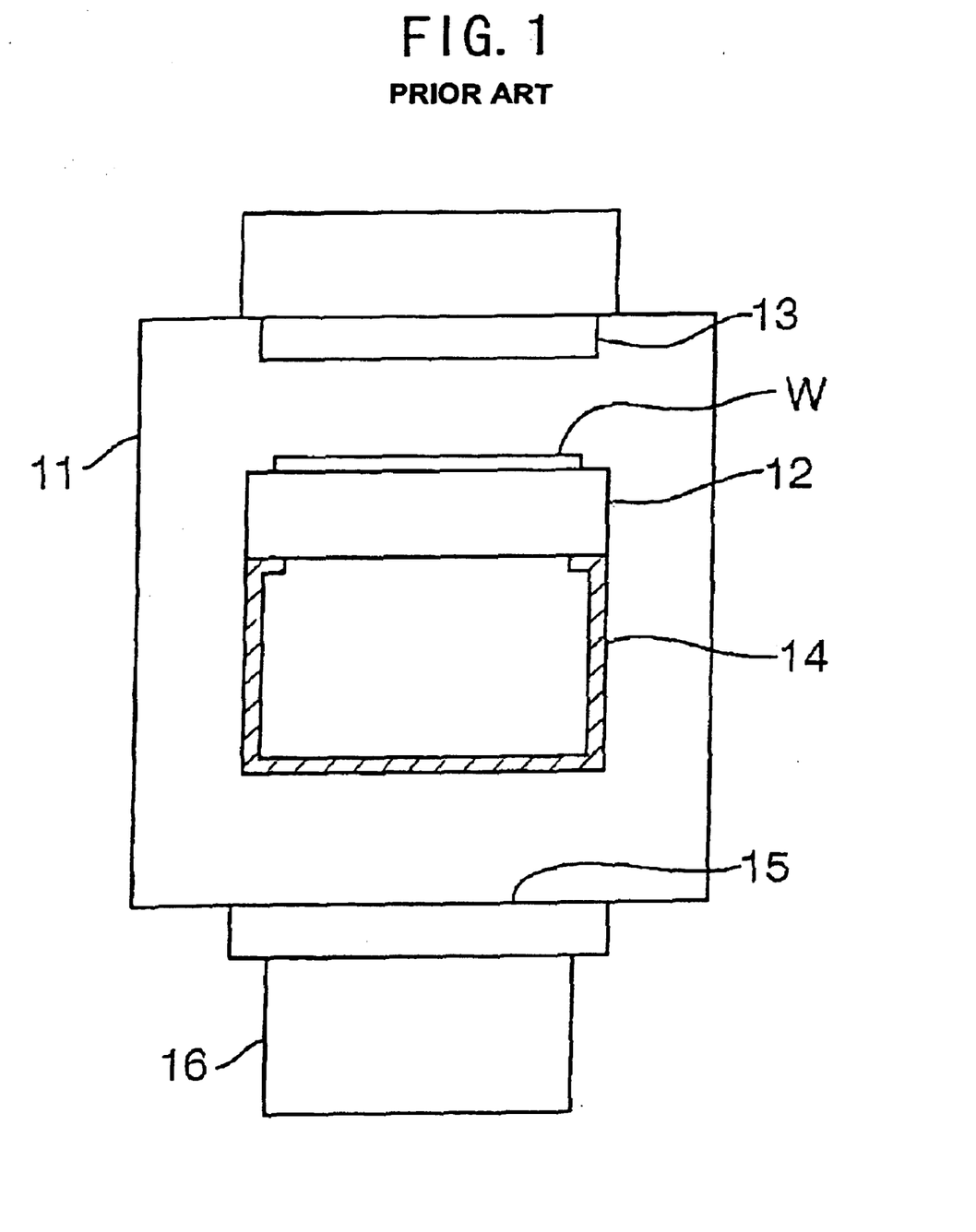
FIG. 1 is an illustration showing a structure of a conventional vacuum processing apparatus.

The plasma CVD apparatus shown in FIG. 1 comprises: a cylindrical vacuum chamber 11, a generally circular placement stage 12 that constitutes a lower electrode; a support part 14 for the placement stage 12; a gas supply part 13 that constitutes an upper electrode; an exhaust port 15; and a turbo-molecular pump 16. The semiconductor wafer W as an object to be processed is placed on the placement stage 12.

In recent years, a diameter of the placement stage 12 increases as a diameter of the semiconductor wafer increases. Accordingly, the placement stage 12 having a diameter equal to or larger than the diameter of the exhaust port 15 exists directly above the exhaust port 15. That is, when viewed from above the gas supply part 13, the exhaust port 15 is in a state in which the entire exhaust port 15 is covered by the placement stage 12. In such a structure, particles such as molecules of a gas moving within the vacuum chamber 11 cannot reach the exhaust port 15 by moving along a straight line. Thus, there is a problem in that exhaust efficiency is lowered.

DISCLOSURE OF INVENTION

It is a general object of the present invention to provide an improved and useful vacuum processing apparatus in which the above-mentioned problem is eliminated.

A more specific object of the present invention is to provide a vacuum processing apparatus which can achieve high exhaust efficiency and a high ultimate vacuum even for an object to be processed having a large diameter.

In order to achieve the above-mentioned objects, there is provided according to one aspect of the present invention a vacuum processing apparatus for applying a predetermined process to an object to be processed which is placed on a substantially circular placement stage provided in a vacuum chamber by supplying a process gas to the vacuum chamber, characterized in that: the vacuum chamber has a substantially circular exhaust port under the placement stage, the exhaust port having a diameter equal to or smaller than a diameter of the placement stage; and a center axis of the exhaust port (9) is displaced from a center axis of the placement stage.

According to the present invention, since a part of the exhaust port protrudes from the placement stage when viewed from above the placement stage, a high-exhaust rate is achieved, and the ultimate vacuum is increased.

The vacuum processing apparatus according to the present invention may be provided with a support part so as to support the placement stage by extending from a side wall of the vacuum chamber toward the center of the vacuum chamber; and a direction of displacement of the center axis of the exhaust port with respect to the center axis of said placement stage is a direction opposite to an extending direction of the support part.

Since an area underneath the support part of the placement stage is covered by the support part, there is less effect of improvement in the exhaust efficiency if the exhaust port protrudes in such area. Accordingly, the exhaust efficiency can be improved at a maximum by having the exhaust port to protrude in a direction opposite to the extending direction of the support part of the placement table.

In the above-mentioned invention, the support part may have a hollow structure, and a utility supply line may be provided therein. Additionally, the utility supply line may include at least one of a gas supply line, a cooling medium supply line and a power supply line. Further, the support part may be detachably attached to the vacuum chamber.

Additionally, in the above-mentioned invention, a baffle plate may be provided so as to surround the placement stage. The baffle plate preferably has many apertures, and an open area ratio on a side to which the exhaust port is displaced may be smaller than an open area ratio on the opposite side.

Additionally, in the above-mentioned invention, a displacement of the center axis of the exhaust port with respect to the center axis of the placement stage is preferably equal to or smaller than one eleventh of a diameter of the exhaust port. The exhaust port is preferably connected to a vacuum pump having a capacity to maintain the vacuum chamber at a pressure less than 10 Pa. The vacuum pump may be a turbo-molecular pump.

Additionally, in the above-mentioned invention, it is preferable that a gas supply part constituting a substantially circular showerhead is provided in the vacuum chamber, and a center axis of the showerhead is coincident with the center axis of the placement stage.

The placement stage and the gas supply part may be configured to apply a film deposition process to the object to be processed. Additionally, an upper electrode and a lower electrode may be provided so as to face to each other, wherein plasma of a process gas is generated between the upper electrode and the lower electrode so as to apply a film deposition process to the object to be processed by the generated plasma.

There is provided according to another aspect of the present invention a vacuum processing method for applying a predetermined process to an object to be processed in a vacuum chamber, the vacuum processing method comprising: placing the object to be processed at a position above an exhaust port of the vacuum chamber, a center of the object being horizontally displaced from a center of the exhaust port by a predetermined distance; and supplying a process gas to the object to be processed from a side opposite to the exhaust port with respect to the object to be processed and exhausting the process gas through the exhaust port so as to apply the predetermined process. The predetermined process may be a film deposition process.

Other objects, features and advantages of the present invention will become more apparent from the following detailed description when read in conjunction with the accompanying drawings.

BEST MODE FOR CARRYING OUT THE INVENTION

Figure 2:
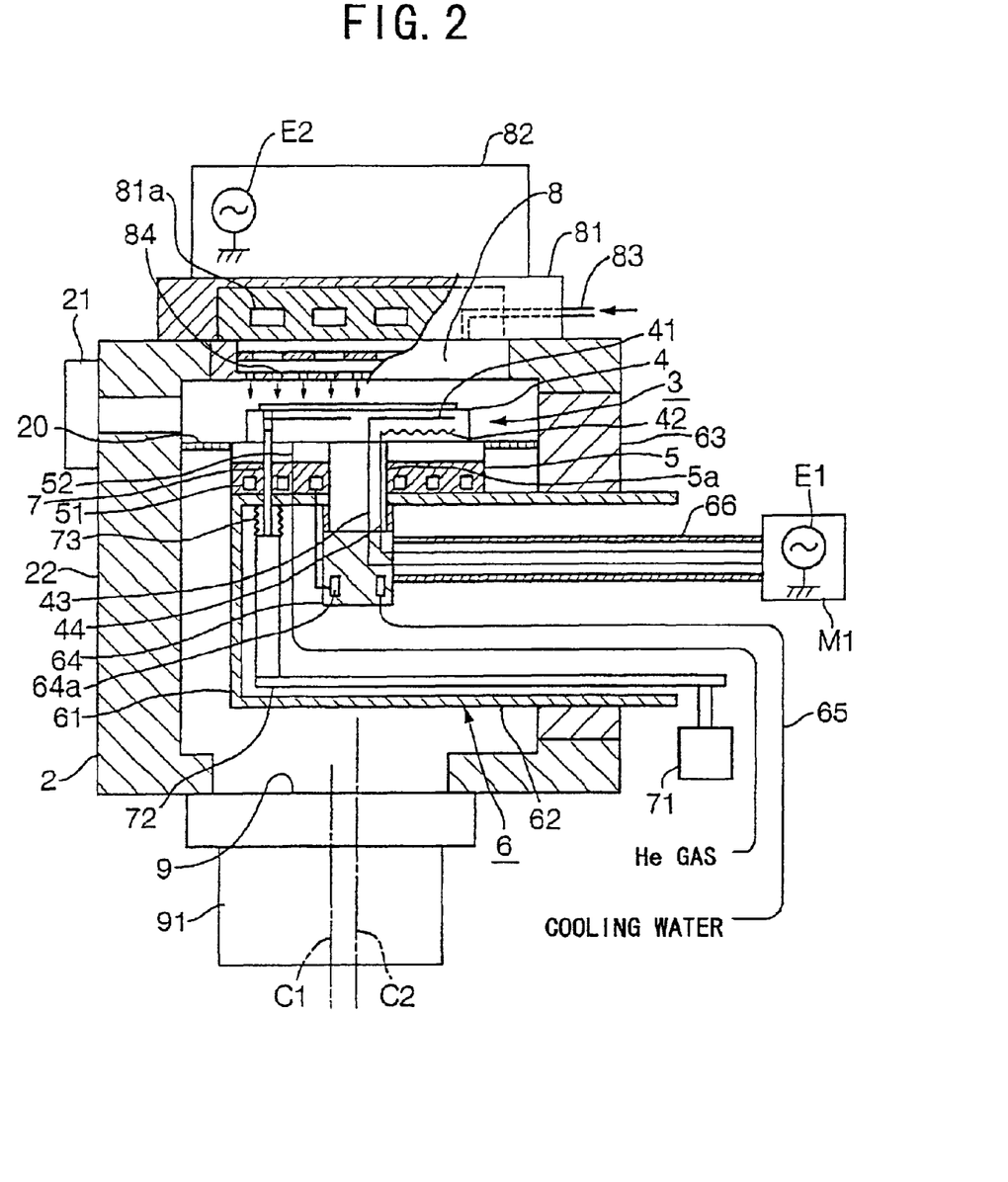
FIG. 2 is a cross-sectional view of a plasma CVD apparatus according to an embodiment of the present invention.
Figure 3:
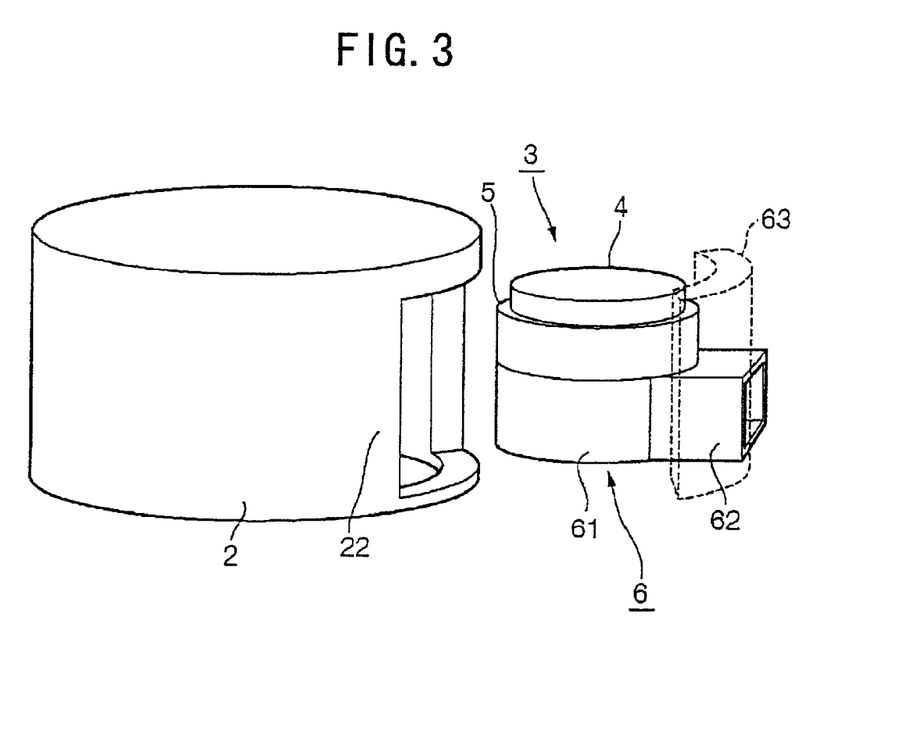
FIG. 3 is a perspective view of a vacuum chamber, a placement stage and a support part.

A description will now be given below, with reference to FIG. 2, of a vacuum processing apparatus according to an embodiment of the present invention. The vacuum processing apparatus according to the embodiment of the present invention shown in FIG. 2 is a plasma CVD apparatus, which applies a CVD process to a wafer as an object to be processed. The plasma CVD apparatus comprises a cylindrical vacuum chamber 2, which is made of aluminum. The vacuum chamber 2 is provided with a gate valve 21 so as to open and close a transportation port of a wafer W. A generally circular placement stage 3 is provided in an upper portion of the vacuum chamber 2 so as to place the wafer W, which is an object to be processed. The placement stage 3 is comprised of a generally circular placement part 4 and a generally circular base part (placement part support stage I) 5 having a diameter slightly larger than the diameter of the placement part 4.

A chuck electrode 41 constituting an electrostatic chuck is embedded in the vicinity of a surface of the placement part 4. Additionally, a heater 42 is embedded under the chuck electrode 41, which heater constitutes a temperature control unit for adjusting a temperature of the wafer W. The chuck electrode 41 also serves as a lower electrode for applying a high-frequency electric power. A cooling medium passage 51 is formed in the base part 5 so as to cool the base part 5 at a predetermined temperature by a cooling medium flowing through the cooling medium passage 51. Additionally, a helium gas supply passage 52 (indicated by a single line in the figure) is provided in the base part 5. Helium gas is supplied to a small gap between the placement part 4 and the base part 5 through the helium gas supply passage 52 so as to control transfer of heat from the base part 5 to the placement part 4 by controlling the pressure of the helium gas. Thereby, the temperature of the wafer W is adjusted in cooperation with a control by the heater 42.

A description will now be given of a support structure of the placement stage 3 (the placement part 4 and the base part 5) in the vacuum chamber 2. The placement stage 3 is supported, as shown in FIG. 2, on a hollow cylindrical part 61 having a diameter approximately equal to the diameter of the base part 5. A hollow rectangular column part 62 is joined to a side of the cylindrical part 61, and an inner space of the cylindrical part 61 and an inner space of the rectangular column part 62 are communicated with each other. The rectangular column part 62 extends outside by passing through a side wall 63 of the vacuum chamber 2, and opens to the outside space of the vacuum chamber 2. That is, the inner space of the rectangular column part 62 communicates with the outside space of the vacuum chamber 2. The opening of the rectangular column part 62 may be closed by a lid member (not shown in the figure). The side wall 63 is joined to the rectangular column part 62, and the side wall 63 together with the rectangular column part 62 can be separated and removed from other side walls 22 of the vacuum chamber 2. In the structure shown in FIG. 2, a support part 6, which has a hollow structure and supports the placement stage 3, is constituted by the cylindrical part 61 and the rectangular column part 62.

The base part 5 is provided with a hole 5a in the center thereof, and a connecting part 64 is provided in the cylindrical part 61 so as to close the hole 5a. A cooling medium passage 64a, which is connected to the cooling medium passage 51, is formed in the connecting part 64. Cooling water is supplied to the cooling medium passages 64a and 51 from a passage member 65 extending in the inner space of the support part 6, which passage member 65 is connected to an external cooling medium supply source (not shown in the figure) such as, for example, a cooling water supply source.

An end of a power supply line 43 is connected to the chuck electrode 41. The power supply line 43 extends through the connecting part 64, and enters an external matching box M1 via a hollow part of the rectangular column part 62 and connected to a high-frequency power source E1. The power supply line 43 is also connected to a direct current power source (not shown in the figure) for the electrostatic chuck. An insulating pipe 66 is provided between the connecting part 64 and the matching box M1, and the power supply line 43 extends through the insulating pipe 66. Additionally, an end of a power supply line 44 is connected to the heater 42, and the power supply source 44 extends through the connecting part 64 and enters the matching box M1 by passing through the insulating pipe 66. Further, the helium gas supply passage 52 also extends through the inner space of the support part 6 and is connected to an external gas supply source (not shown in the figure). In the example shown in FIG. 2, the gas supply passage 52, the passage member 65 and power supply lines 43 and 44 correspond to a utility supply line.

The placement stage 3 is provided with three lift pins 7, which are arranged along a circumference and penetrate the placement stage 3, so as to push up the wafer W. The lift pins 7 are vertically movable by a vertically moving mechanism 71 provided outside the support part 6 via a vertically moving member 72 provided in the support part 6. It should be noted that each of through holes in which the lift pins 7 are provided is sealed by a bellows 73. Additionally, a signal line of a sensor (not shown in the figure) for detecting a temperature of a back surface of the wafer W or the base part 5 is provided in the inner space of the support part 6. The signal line and a power supply line of the sensor also correspond the utility supply line.

A gas supply part 8 constituting a showerhead is provided to a ceiling of the vacuum chamber 2 so as to face the placement stage 3. A matching box 82 is mounted on the gas supply part 8 via a cooling part 81 in which a cooling medium passage 81a is formed. The gas supply part 8 is configured to eject a process gas, which is supplied through a gas supply pipe 83, toward the wafer W through many apertures 84. Additionally, the gas supply part 8 also serves as an upper electrode, and is connected to a high-frequency power source E2 in the matching box 82 and is insulated from the vacuum chamber 2.

A baffle plate 20 is provided between the outer surface of the placement stage 3 and the inner wall of the vacuum chamber 2. The baffle plate 20 has many apertures so that the open area ratio thereof is approximately 25%. An exhaust port 9 is formed on the bottom of the vacuum chamber 2, which exhaust port has a diameter approximately equal to or smaller than a diameter of the placement stage 3. The diameter of the placement stage 3 is a maximum diameter in the placement stage. That is, in the example shown in FIG. 2, the diameter of the placement stage 3 corresponds to the diameter of the base part 5, which is 288 mm, and the diameter of the exhaust port 9 is 270 mm. A turbo-molecular pump 91 as a vacuum pump is connected to the exhaust port 9.

The center axis Cl of the exhaust port 9 is displaced from the center axis C2 of the placement stage 3. The direction of displacement is a direction opposite to the support part 6, that is, a reverse direction of a direction in which the support part 6 extends toward the side surface of the vacuum chamber 2. Additionally, the displacement D, which is a distance between the center axis C1 of the exhaust port 9 and the center axis C2 of the placement stage 3, is set to 15 mm. The method for setting the displacement D will be described later.

A description will now be given of an operation of the above-mentioned plasma CVD apparatus. First, the vacuum chamber 2 is evacuated until a predetermined vacuum is created. Thereafter, a wafer W is carried in the vacuum chamber 2 through the gate valve 21 by a transport arm (not shown in the figure), and the wafer W is placed on the placement stage 3. The placement of the wafer W on the placement stage 3 is performed by vertically moving the lift pins 7. Then, the vacuum chamber 2 is maintained at a predetermined vacuum, for example, 0.266 Pa to 0.399 Pa (2 mTorr to 3 mTorr) while supplying monosilane ($SiH_4$) gas, which is a process gas, and oxygen $O_2$) gas from the gas supply part 42 to the vacuum chamber 2 at predetermined flow rates, respectively. Then, high-frequency power of 2 MHz, 1 kW and 16 MHz, 3 kW is applied to the lower electrode (placement stage) 3 and the upper electrode (gas supply part) 8 by the high-frequency power sources E1 and E2, respectively. Thereby, a high-frequency electric field is generated between the lower electrode 3 and the upper electrode 8 so as to generated plasma of the process gas by the energy of the high frequency wave. Then, a silicon oxidation film is formed on the wafer W by irradiating the generated plasma onto the wafer W.

Figure 4:
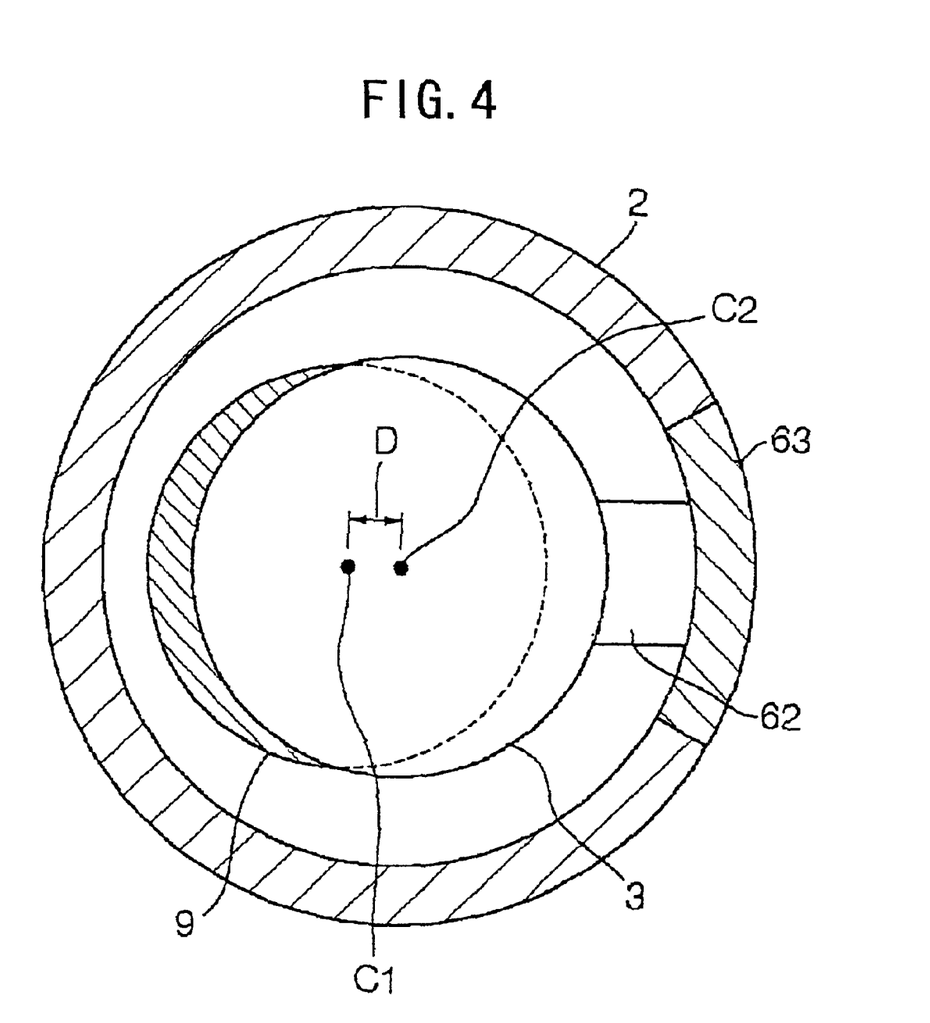
FIG. 4 is a plan view of an exhaust port and the placement stage.

According to the above-mentioned embodiment, the center axis C1 of the exhaust port 9 is displaced from the center axis C2 of the placement stage 3 in a direction opposite to the support part 6, and, thereby, when viewed from above the exhaust port 9 (that is, when viewed from a side of the gas supply part 8 constituting the showerhead), there is a part in which the placement stage 3 and the support part 6 do not overlap the exhaust port 9. Accordingly, as indicated by a hatched semilunar part in FIG. 4, the part of the exhaust port 9 protrudes from a projected area of the placement stage 3 and the support part 6. Thus, particles such as gas molecules moving in the vacuum chamber 2 can reach the exhaust port 9 by moving along a straight line. Thereby, the probability of particles entering the exhaust port 9 is increased, which achieves high exhaust efficiency. Thereby, when the diameter of the wafer W is increased, the vacuum chamber 2 can be evacuated with high exhaust efficiency by using a small pump as the turbo-molecular pump 91 such as, for example, a turbo-molecular pump having an exhaust rate of 1800 liters/second. Additionally, the ultimate vacuum is increased, and a film deposition process with a good gap fill characteristic can be performed.

Further, since the support part 6 can be removed together with the placement stage 3 from the vacuum chamber 2, a maintenance operation with respect to the placement stage 3 is facilitated. Additionally, since the support part 6 has a hollow structure, a maintenance operation related to the utility can be performed without removing the support part 6 from the vacuum chamber 2. Thus, the vacuum processing apparatus according to the present embodiment can provide an easy maintenance operation.

Additionally, since the vacuum processing apparatus according to the present embodiment is provided with the baffle plate 20, evacuation of gas can be performed with high isotropy. That is, the baffle plate 20 has a function to compensate for a deflection of exhaust caused by the displacement of the exhaust port 9 with respect to the placement stage 3. Although the open area ratio of the baffle plate 20 in this embodiment is approximately 25% as the entire baffle plate, the open area ratio of an area above a part of the exhaust port 9 protruding from the placement stage 3 is locally smaller than the open area ratio of other parts of the baffle plate 20. Thereby, the deflection of exhaust caused by the displacement of the exhaust port 9 with respect to the placement table 3 is compensated for.

Figure 5:
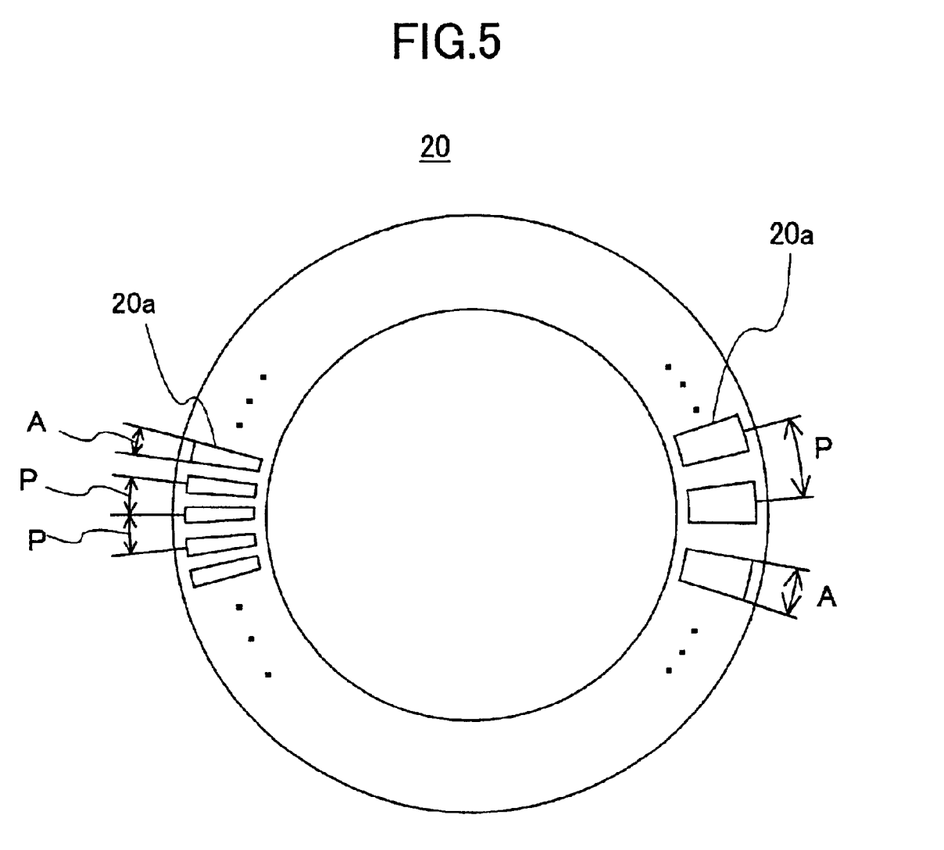
FIG. 5 is a plan view of a baffle plate used in the plasma CVD apparatus shown in FIG. 2.

FIG. 5 is a plan view of the baffle plate 20 used in the present embodiment. As shown in FIG. 5, many slits 20a are formed in the baffle plate 20 by being arranged in a circumferential direction, and a pitch P of the slits 20a is larger on the side of the exhaust port 9 protruding from the placement stage 3 and is smaller on the opposite side. Additionally, the width A of each of the slits 20a is smaller on the protruding side, and is larger on the opposite side. Thereby, the open area ratio of the baffle plate is locally changed. The configuration of changing the open area ratio is not limited to the above-mentioned structure, and, for example, a length of each of the slits 20a may be changed. It should be noted that there is no need to always provide the baffle plate 20 if the deflection of exhaust is in a negligible degree.

In the structure of the present embodiment, the displacement of the exhaust port 9 with respect to the placement stage 3 has a reverse action that the exhaust rate is reduced. That is, when the exhaust port 9 is displaced from the placement stage 3, there is an area that is located deep inside the projected area of the placement stage 3. If the displacement D is large, a degree of decrease in the exhaust efficiency due to the area inside the projected area of the placement stage 3 may become greater than a degree of increase in the exhaust efficiency due to the area protruding from the projected area of the placement stage 3. The exhaust rate in such as case becomes smaller than that when the exhaust port 9 is not displaced. Accordingly, the displacement D must be determined in consideration with this point.

Additionally, if a large displacement is provided to the exhaust port 9 and the isotropy of exhaust is maintained by the baffle plate 20, the conductance (resistivity) provided by the baffle plate 20 is increased, which causes a decrease in the exhaust efficiency (exhaust rate) as a whole.

Figure 6:
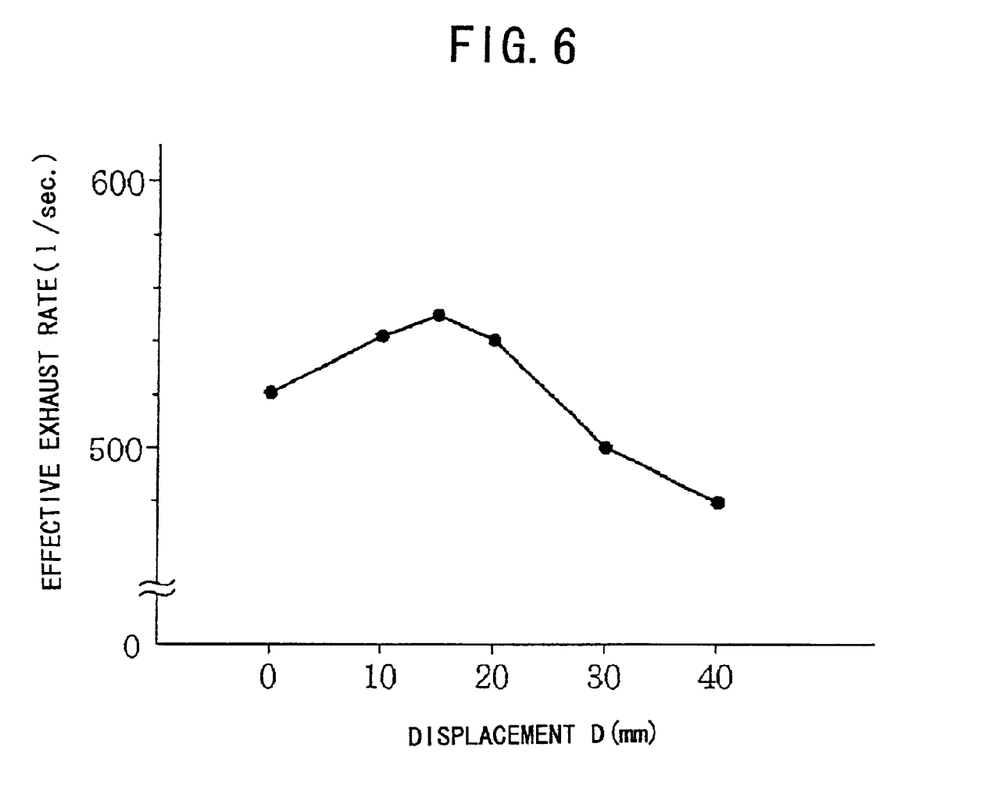
FIG. 6 is a graph showing a relationship between a displacement of a center axis of the exhaust port with respect to a center axis of the placement stage.

FIG. 6 is a graph showing a result of investigation of a relationship between an effective exhaust rate and the displacement D of the center axis C1 of the exhaust port 9 with respect to the center axis C2 of the placement stage 3. When the displacement D was increased, the exhaust rate was also increased and maximized at about 15 mm. When the displacement D exceeded approximately 15 mm, the exhaust rate was decreased and became smaller than that when the exhaust port 9 was not displaced when the displacement was at approximately 25 mm. That is, the effective exhaust rate was at a maximum when the displacement D was approximately 15 mm, and the exhaust rate was increased when the displacement D is less smaller than approximately 25 mm. The diameter of the export port 9 was 270 mm, and it was found that the displacement D is preferably less than one eleventh of the diameter of the exhaust port 9. The present invention is based on the above-mentioned findings, and the vacuum processing apparatus according to the present invention can achieve high efficiency exhaust since the displacement D is set to 15 mm.

Additionally, the present invention is especially effective in a case in which a gas flow in the vacuum chamber 2 is in the middle between a viscous flow and a molecular flow or in the range of the molecular flow. Accordingly, for example, the present invention is suitable for a case in which a process is performed under a pressure lower than 10 Pa.

In the above-mentioned embodiment, the vacuum pump is not limited to the turbo-molecular pump. Additionally, as for the process performed under a vacuum, there is an etching process, a sputtering process or an ashing process.

The present invention is not limited the specifically disclosed embodiments, and variations and modifications may be made without departing form the scope of the present invention.

What is claimed is:

1. A vacuum processing apparatus for applying a predetermined process to an object to be processed which is placed on a substantially circular placement stage provided in a vacuum chamber by supplying a process gas to the vacuum chamber,
   wherein:
      said vacuum chamber has a substantially circular exhaust port under said placement stage, the exhaust port having a diameter equal to or smaller than a diameter of said placement stage;
      a center axis of said exhaust port is displaced from a center axis of said placement stage and said center axis of said placement stage passes inside of said exhaust port; and
      a foot-print of said placement stage covers less than a whole surface of said exhaust port.

2. The vacuum processing apparatus as claimed in claim 1, wherein:
      a support part is provided to support said placement stage by extending from a side wall of said vacuum chamber toward a center of said vacuum chamber; and
      a direction of displacement of the center axis of said exhaust port with respect to the center axis of said placement stage is a direction opposite to an extending direction of said support part.

3. The vacuum processing apparatus as claimed in claim 2, wherein said support part has a hollow structure, and a utility supply line is provided therein.

4. The vacuum processing apparatus as claimed in claim 3, wherein said utility supply line includes at least one of a gas supply line, a cooling medium supply line and a power supply line.

5. The vacuum processing apparatus as claimed in claim 3, wherein said support part is detachably attached to said vacuum chamber.

6. The vacuum processing apparatus as claimed in one of claims 1 to 5, wherein a baffle plate is provided to surround said placement stage.

7. The vacuum processing apparatus as claimed in claim 6, wherein said baffle plate has a plurality of apertures, and an open area ratio on a side to which said exhaust port is displaced is smaller than an open area ratio on an opposite side to which said exhaust port is displaced.

8. The vacuum processing apparatus as claimed in one of claims 1 to 5, wherein a displacement of the center axis of said exhaust port with respect to the center axis of said placement stage is equal to or smaller than one eleventh of a diameter of said exhaust port.

9. The vacuum processing apparatus as claimed in one of claims 1 to 5, wherein said exhaust port is connected to a vacuum pump having a capacity to maintain said vacuum chamber at a pressure less than 10 Pa.

10. The vacuum processing apparatus as claimed in claim 9, wherein said vacuum pump is a turbo-molecular pump.

11. The vacuum processing apparatus as claimed in one of claims 1 to 5, wherein a gas supply part constituting a substantially circular showerhead is provided in said vacuum chamber, and a center axis of said showerhead is coincident with the center axis of said placement stage.

12. The vacuum processing apparatus as claimed in claim 11, wherein said placement stage and said gas supply part are configured to supply a film deposition process to said object to be processed.

13. The vacuum processing apparatus as claimed in one of claims 1 to 5, wherein an upper electrode and a lower electrode are provided facing each other, and plasma of a process gas is generated between said upper electrode and said lower electrode to apply a film deposition process to said object to be processed by the generated plasma.

* * * * *